(12) United States Patent
Shim

(10) Patent No.: US 7,710,173 B2
(45) Date of Patent: May 4, 2010

(54) DUTY CYCLE CORRECTION CIRCUIT AND DELAY LOCKED LOOP CIRCUIT INCLUDING THE SAME

(75) Inventor: Seok-Bo Shim, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/265,943

(22) Filed: Nov. 6, 2008

(65) Prior Publication Data
US 2009/0322390 A1 Dec. 31, 2009

(30) Foreign Application Priority Data
Jun. 30, 2008 (KR) .................. 10-2008-0063140

(51) Int. Cl.
*H03L 7/06* (2006.01)
(52) U.S. Cl. .................. 327/158; 327/149
(58) Field of Classification Search .......... 327/158, 327/149
See application file for complete search history.

(56) References Cited

U.S. PATENT DOCUMENTS

| | | | |
|---|---|---|---|
| 6,853,225 B2 | 2/2005 | Lee et al. | |
| 6,859,081 B2 | 2/2005 | Hong et al. | |
| 6,963,235 B2 | 11/2005 | Lee et al. | |
| 7,360,135 B2 * | 4/2008 | Boerstler et al. | 714/733 |
| 7,535,270 B2 * | 5/2009 | Lee et al. | 327/147 |
| 7,612,593 B2 * | 11/2009 | Kim et al. | 327/175 |
| 2004/0066873 A1 | 4/2004 | Cho et al. | |
| 2004/0189364 A1 * | 9/2004 | Lee et al. | 327/175 |
| 2006/0001462 A1 * | 1/2006 | Kim et al. | 327/144 |
| 2006/0197565 A1 | 9/2006 | Kang | |
| 2007/0200604 A1 * | 8/2007 | Yun et al. | 327/158 |

(Continued)

FOREIGN PATENT DOCUMENTS

JP 2002-042469 2/2002

(Continued)

OTHER PUBLICATIONS

Notice of Preliminary Rejection issued from Korean Intellectual Property Office on Aug. 5, 2009 with an English Translation.

(Continued)

*Primary Examiner*—Lincoln Donovan
*Assistant Examiner*—Adam D Houston
(74) *Attorney, Agent, or Firm*—IP & T Law Firm PLC

(57) ABSTRACT

A duty cycle correction circuit and a delay locked loop circuit including the same are capable of reducing area and power consumption of a circuit. The delay locked loop circuit includes a delay locked loop unit, a delay controller, a duty cycle ratio correction circuit, and a duty cycle ratio detector. The delay locked loop unit outputs an internal clock by delaying an external clock in order to compensate a clock skew. The delay controller outputs a delay internal clock by delaying the internal clock in response to correction signals. The duty cycle ratio correction circuit outputs an internal correction clock by increasing or decreasing a high level section of the internal clock according to the correction signals. The duty cycle ratio detector outputs the correction signals in accordance with a duty cycle ratio of the internal correction clock.

12 Claims, 6 Drawing Sheets

U.S. PATENT DOCUMENTS

| | | | |
|---|---|---|---|
| 2008/0191757 A1* | 8/2008 | Choi | 327/149 |
| 2009/0058481 A1* | 3/2009 | Kim et al. | 327/175 |
| 2009/0146706 A1* | 6/2009 | You | 327/158 |
| 2009/0231006 A1* | 9/2009 | Jang et al. | 327/175 |
| 2009/0295446 A1* | 12/2009 | Yun et al. | 327/175 |

FOREIGN PATENT DOCUMENTS

| | | |
|---|---|---|
| JP | 2004129255 | 4/2004 |
| KR | 1020010004959 A | 1/2001 |
| KR | 1020050103698 A | 11/2005 |
| KR | 1020080020275 A | 3/2008 |

OTHER PUBLICATIONS

Notice of Allowance issued from Korean Intellectual Property Office on Nov. 19, 2009.

* cited by examiner

DUTY CYCLE CORRECTION CIRCUIT AND DELAY LOCKED LOOP CIRCUIT INCLUDING THE SAME

CROSS-REFERENCES TO RELATED APPLICATIONS

The present invention claims priority of Korean patent application number 10-2008-0063140, filed Jun. 30, 2008, which is incorporated by reference in its entirety.

BACKGROUND OF THE INVENTION

The present invention relates to a duty cycle correction circuit and a delay locked loop circuit including the same, and more particularly to a delay locked loop circuit capable of reducing the area and power consumption of the circuit.

Generally, delay locked loop circuits refer to circuits which control the timing of data output from a memory device using a clock input from outside of the memory device, e.g., a synchronous semiconductor memory device.

In order to transmit output data from the memory device to a chip set without an error, the memory device and the chip set should be synchronized with the clock. However, because the internal circuit of the memory device delays the clock input from the chip set to the memory device, a phase difference occurs between an external clock input to the memory device and an internal clock of the memory device. The delay locked loop circuit compensates the phase difference between the external clock and the internal clock by removing a clock skew caused by the memory device's internal circuit.

Meanwhile, it is very important accurately to control the duty cycle ratio of the clock used in the memory device. The duty cycle ratio is the ratio of an interval occupied by a high level section and an interval occupied by a low level section during one clock cycle. For example, if the duty cycle ratio is 50:50, it means that the high level section occupies a time interval equal to that of the low level section during one clock cycle.

When the duty cycle ratio of the clock is not accurately controlled, the margin of data is not secured, so that the data may be distorted. Especially, because the data is input or output not only at the rising edge but also at the falling edge of the clock in Double Data Rate (DDR) synchronous semiconductor memory devices (SDRAM), the duty cycle ratio of the clock is more important in relation to the margin security of the data section in the DDR SDRAM. The duty cycle correction circuit corrects the duty cycle ratio of the clock to 50:50.

FIG. 1 is block diagram of a delay locked loop circuit including a conventional duty cycle correction circuit. Referring to FIG. 1, the conventional delay locked loop circuit includes a first delay locked loop unit 101, a second delay locked loop unit 131, and a duty cycle correction unit 151.

The first delay locked loop unit 101 includes a first phase comparator 103, a first delayer 105 and a first replica model 107. The second delay locked loop unit 131 includes a second phase comparator 133, a second delayer 135 and a second replica model 137. The duty cycle correction unit 151 includes a phase mixer 153 and a duty cycle ratio detector 155.

The first phase comparator 103 compares phases of an external clock EXT_CLK and a first feedback clock FB_1 output from the first replica model 107. The first replica model 107 includes a clock delay component in a semiconductor memory device, and outputs the first feedback clock FB_1 by receiving a first internal clock CLK_1. The phase comparison result CMP_1 is input to the first delayer 105. The first delayer 105 delays the external clock EXT_CLK by controlling the delay degree to match the phase of the first feedback clock FB_1 with that of the external clock EXT_CLK, thereby outputting the first internal clock CLK_1 which is delay-fixed.

The second delay locked loop unit 131 performs an operation similar to the first delay locked loop unit 101 to match a phase of a second feedback clock FB_2 with that of the external clock EXT_CLK, and outputs a second internal clock CLK_2 which is delay-fixed. The rising edges of the second internal clock CLK_2 and the first internal clock CLK_1 are phase-matched with each other. However, because the second delayer 135 reverses the external clock EXT_CLK, the duty cycle ratio of the second internal clock CLK_2 is opposite to the duty cycle ratio of the first internal clock CLK_1. A bubble on the output terminal of the second delayer 135 means the reversal of the phase. For example, if the duty cycle ratio of the first internal clock CLK_1 is 40:60, the duty cycle ratio of the second internal clock CLK_2 is 60:40.

The first internal clock CLK_1 and the second internal clock CLK_2 are input to the duty cycle correction unit 151. The duty cycle ratio detector 155 detects the duty cycle ratios of the first internal clock CLK_1 and the second internal clock CLK_2 to output a correction signal CRTL to the phase mixer 153.

The phase mixer 153 corrects the duty cycle ratios of the first internal clock CLK_1 and the second internal clock CLK_2 in response to the correction signal CRTL. The phase mixer 153 drives the first internal clock CLK_1 and the second internal clock CLK_2 with a driving force varied in accordance with the duty cycle ratios of the first internal clock CLK_1 and the second internal clock CLK_2, and mixes the phases of the first internal clock CLK_1 and the second internal clock CLK_2.

The phase mixer 153 may include a plurality of inverters, which are turned on or off in response to the correction signal CRTL to drive the first internal clock CLK_1 and the second internal clock CLK_2 with different driving forces, respectively. The more inverters that are turned on in response to the correction signal CRTL, the more strongly the first internal clock CLK_1 or the second internal clock CLK_2 is driven.

FIG. 2 is a diagram illustrating an operation of the phase mixer 153 in FIG. 1, which shows a high level section of the first internal clock CLK_1 and the second internal clock CLK_2.

The high level section of the first internal clock CLK_1 as described with reference to FIG. 2 is narrower than a low level section of the first internal clock CLK_1.

The phase mixer 153 drives the first internal clock CLK_1 and the second internal clock CLK_2 by controlling a driving force in response to the correction signal CRTL. When the second internal clock CLK_2 be driven more strongly than the first internal clock CLK_1, the falling edge of the output signal from the phase mixer 153 moves toward the falling edge side of the second internal clock CLK_2. When the first internal clock CLK_1 is driven more strongly than the second internal clock CLK_2, the falling edge of the output signal from the phase mixer 153 moves toward the falling edge side of the first internal clock CLK_1.

FIG. 3 is a timing diagram of the clock of the delay locked loop circuit in FIG. 1.

The duty cycle ratio of the external clock EXT_CLK is not 50:50. The high level section is narrower than the low level section. The first internal clock CLK_1 is generated by delaying the external clock EXT_CLK by a delay degree in response to a phase comparison result CMP_1 of the first phase comparator 103. Similarly, the second internal clock CLK_2 is generated by delaying the external clock EXT_CLK by a delay degree in response to a phase comparison result CMP_2 of the second phase comparator 133. The rising edge of the second internal clock CLK_2 phase-matches the rising edge of the first internal clock CLK_1, but the duty cycle ratio is the opposite.

Because the duty cycle ratio of the first internal clock CLK_1 is opposite to that of the second internal clock CLK_2, the duty cycle ratio detector 155 outputs the correction signal CRTL turning on inverters so that the number of inverters driving the first internal clock CLK_1 may be identical to the number of inverters driving the second internal clock CLK_2. The phase mixer 153 mixed phases of the first internal clock CLK_1 and the second internal clock CLK_2 by driving the first internal clock CLK_1 and the second internal clock CLK_2 using the turned-on inverters. Accordingly, each of duty cycle ratios of the output clocks OUT_1 and OUT_2 becomes 50:50.

As described above, because the conventional delay locked loop circuit corrects the duty cycle ratio by generating two clocks, two delay locked loop units are provided. Accordingly, the conventional delay locked loop circuit requires a greater circuit area, and consumes much power.

SUMMARY OF THE INVENTION

Embodiments of the present invention are directed to providing a duty cycle correction circuit capable of reducing an area and power consumption of a circuit and a delay locked loop circuit including the same.

In accordance with an aspect of the invention, there is provided a delay locked loop circuit, which includes a delay locked loop unit configured to output an internal clock by delaying an external clock in order to compensate a clock skew, a delay controller configured to output a delay internal clock by delaying the internal clock in response to correction signals, a duty cycle ratio correction circuit configured to output an internal correction clock by increasing or decreasing a high level section of the internal clock according to the correction signals, and a duty cycle ratio detector configured to output the correction signals in accordance with a duty cycle ratio of the internal correction clock.

In accordance with another aspect of the invention, there is provided a duty cycle correction circuit, which includes a delay controller configured to generate a delay clock by delaying a clock in response to correction signals, a duty cycle ratio correction circuit configured to output a correction clock by controlling a high level section of the clock according to the correction signals, and a duty cycle ratio detector configured to output the correction signals in accordance with a duty cycle ratio of the correction clock.

DESCRIPTION OF SPECIFIC EMBODIMENTS

Hereinafter, a duty cycle correction circuit and a delay locked loop circuit including the same in accordance with the present invention will be described in detail with reference to the accompanying drawings.

Figure 4:
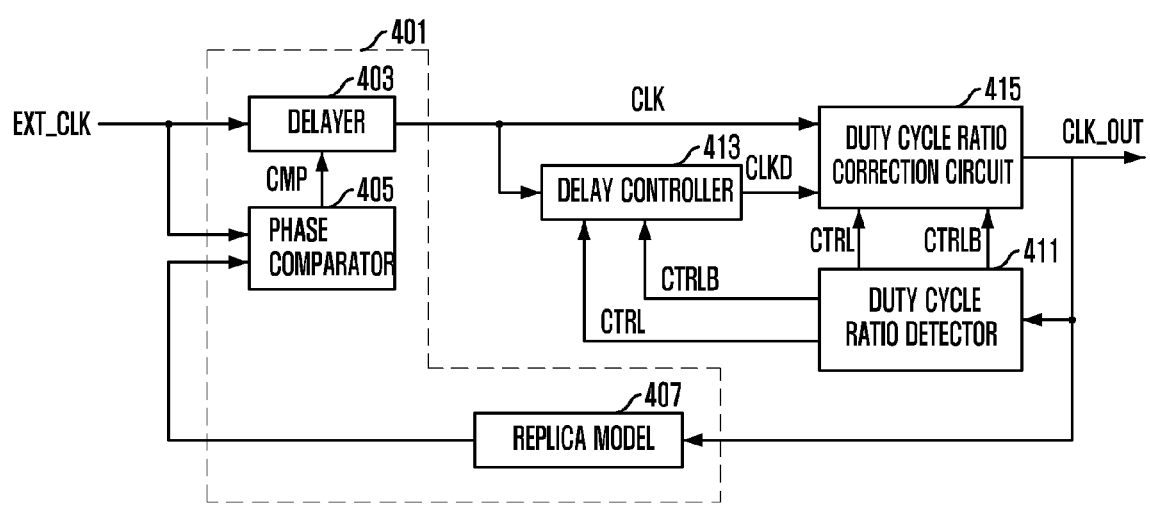
FIG. 4 is a block diagram of a delay locked loop circuit in accordance with an embodiment of the present invention.

FIG. 4 is a block diagram of a delay locked loop circuit in accordance with an embodiment of the invention.

Referring to FIG. 4, a delay locked loop circuit in accordance with the embodiment of the invention includes a delay locked loop unit 401, a delay controller 413, a duty cycle ratio correction circuit 415 and a duty cycle ratio detector 411.

Figure 1:
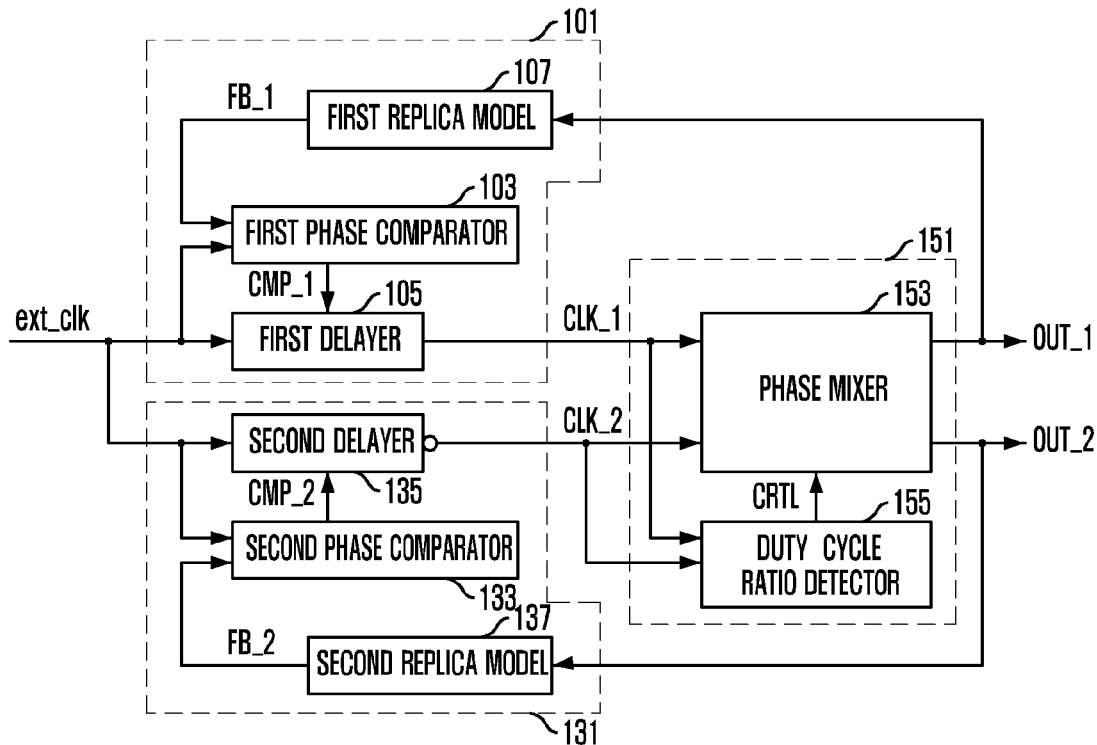
FIG. 1 is a block diagram of a delay locked loop circuit including a conventional duty cycle correction circuit.
Figure 2:
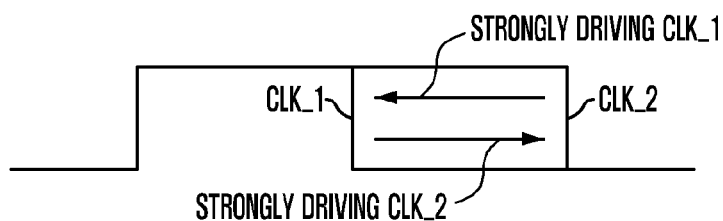
FIG. 2 is a diagram illustrating an operation of a phase mixer in FIG. 1.
Figure 3:
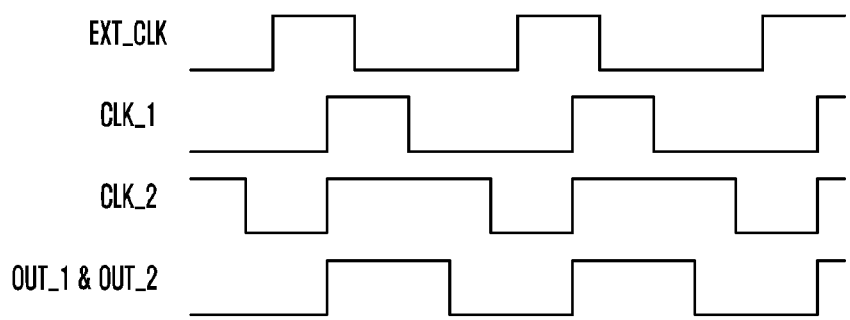
FIG. 3 is a timing diagram of a clock by the delay locked loop circuit in FIG. 1.

The delay locked loop unit 401 includes a delayer 403, a phase comparator 405 and a replica model 407. The delay locked loop unit 401 outputs an internal clock CLK by delaying an external clock EXT_CLK in order to compensate a clock skew of a semiconductor memory device like the conventional delay locked loop units 101 and 131 as described with reference to FIG. 1. However, the delay locked loop circuit in accordance with the embodiment of the invention can correct the duty cycle ratio of the internal clock CLK with only one delay locked loop unit 401 differently from the conventional technology. Accordingly, the invention has an advantage of reducing an area and power consumption of a circuit.

The duty cycle ratio detector 411 outputs correction signals CRTL and CRTLB charged or discharged in accordance with the duty cycle ratio of a correction clock CLK_OUT, which is an output signal of the duty cycle ratio correction circuit 415. The correction signals CRTL and CRTLB are signals transitioning to the opposite logic level in accordance with the duty cycle ratio of the correction clock CLK_OUT and a reversal correction clock CLK_OUTB. For example, if a high level section of the correction clock CLK_OUT is narrower than its low level section, the correction signal CRTL transitions to the logic high level, and the correction signal CRTLB transitions to the logic low level. If the high level section of the correction clock CLK_OUT is wider than its low level section, the correction signal CRTL transitions to the logic low level, and the correction signal CRTLB transitions to the logic high level.

The delay controller 413 delays the internal clock CLK by determining a delay degree in response to the correction signals CRTL and CRTLB. The internal clock CLK output from the delayer 403 and a delay internal clock CLKD output from the delay controller 413 are input to the duty cycle ratio correction circuit 415.

The duty ratio correction circuit 415 compares the logic levels of the internal clock CLK and the delay internal clock CLKD. If the high level section of the internal clock CLK is narrower than its low level section, a first logical operation is performed. If the high level section of the internal clock CLK is wider than its low level section, a second logical operation is performed. The first logical operation or the second logical operation is selectively performed in accordance with the correction signals CRTL and CRTLB.

As an example of an embodiment, the first logical operation and the second logical operation may be OR operation and AND operation between the internal clock CLK and the delay internal clock CLKD, respectively. As another example of an embodiment, the first logical operation and the second logical operation may be NOR operation and NAND operation between the internal clock CLK and the delay internal clock CLKD, respectively. Hereinafter, it will be assumed that the first logical operation and the second logical operation are OR operation and AND operation between the internal clock CLK and the delay internal clock CLKD, respectively.

The duty cycle ratio of the delay internal clock CLKD and the duty cycle ratio of the internal clock CLK are identical to each other. Accordingly, when the high level section of the internal clock CLK is narrower than its low level section, the first logical operation increases the width of the high level section of the internal clock CLK by the delay degree of the delay internal clock CLKD. When the high level section of the internal clock CLK is wider than its low level section, the second logical operation decreases the width of the high level section of the internal clock CLK by the delay degree of the delay internal clock CLKD. Meanwhile, the period of the internal clock CLK is constantly maintained. Accordingly, if the high level section of the internal clock CLK increases, the low level section decreases. If the high level section of the internal clock CLK decreases, the low level section increases. Thus, the duty cycle ratio correction circuit 415 generates the correction clock CLK_OUT by correcting the duty cycle ratio of the internal clock CLK.

Finally, according to the embodiment of the invention, it is possible to reduce the circuit area and the power consumption by correcting the duty cycle ratio using the internal clock CLK output from one delay locked loop unit and the delay internal clock CLKD delayed from the same.

Figure 5:
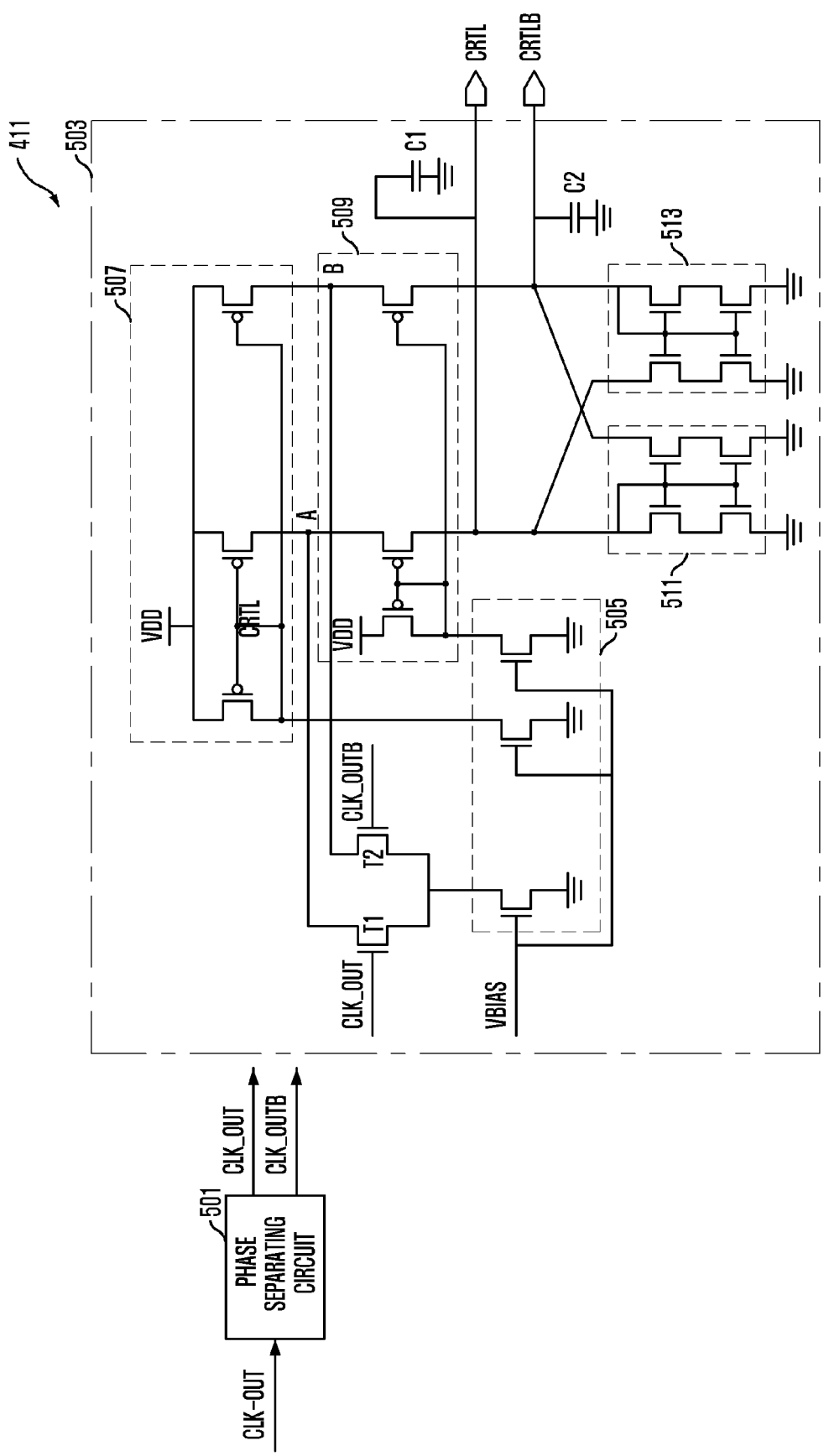
FIG. 5 is a detailed block diagram of a duty ratio detector in FIG. 4.

FIG. 5 is a detailed block diagram of the duty cycle ratio detector 411 in FIG. 4.

Referring to FIG. 5, the duty cycle ratio detector 411 includes a phase separating circuit 501 and a charge pump 503.

The phase separating circuit 501 generates a reversal correction clock CLK_OUTB obtained by reversing the correction clock CLK_OUT output from the duty cycle ratio correction circuit 411, and outputs the reversal correction clock CLK_OUTB to the charge pump 503 together with the correction clock CLK_OUT.

The charge pump 503 generates the correction signals CRTL and CRTLB charged or discharged in response to each of duty cycle ratios of the correction clock CLK_OUT and the reversal correction clock CLK_OUTB.

The correction clock CLK_OUT and the reversal correction clock CLK_OUTB are input to first and second NMOS transistors T1 and T2 of the charge pump 503, respectively. In accordance with a bias voltage VBIAS, a bias transistor 505 is controlled to be turned on or off, and current mirrors 507 and 509 are also controlled to be turned on or off. The current sources 511 and 513 supplies current to the charge pump 503.

Meanwhile, the correction clock CLK_OUT may have three cases of the duty cycle ratio. That is, the high level section of the correction clock CLK_OUT is identical to, smaller or greater than the low level section. Hereinafter, each of the cases will be described.

When the high level section of the correction clock CLK_OUT is smaller than the low level section, a turn-on time of the first NMOS transistor T1 is smaller than a turn-on time of the second NMOS transistor T2 because the high level section of the correction clock CLK_OUT is smaller than the high level section of the reversal correction clock CLK_OUTB.

Accordingly, a current quantity flowing from a B node to the second NMOS transistor side T2 is greater than a current quantity flowing from an A node to the first NMOS transistor T1. Finally, the logic level of the correction signal CRTLB falls because a second capacitor C2 is not able to be plentifully charged with electric charges due to much more current quantity flowing toward the second NMOS transistor T2. On the other hand, the logic level of the correction signal CRTL rises because a first capacitor C1 is plentifully charged with electric charges due to relatively much less current quantity flowing toward the first NMOS transistor T1.

On the contrary, when the high level section of the correction clock CLK_OUT is wider than the high level section of the reversal correction clock CLK_OUTB, the turn-on time of the first NMOS transistor T1 is longer than the turn-on time of the second NMOS transistor T2. Accordingly, electric charges are more plentifully charged into the second capacitor C2 than the first capacitor C1. The logic level of the correction signal CRTLB rises, and the logic level of the correction signal CRTL falls.

When the high level section of the correction clock CLK_OUT and the high level section of the reversal correction clock CLK_OUTB are identical to each other, the correction signals CRTL and CRTLB are not changed to the logic levels opposite to each other because amount of electric charges charged into the first and the second capacitors C1 and C2 are identical to each other.

The correction signals CRTL and CRTLB in accordance with each duty cycle ratio are used as a control signal in the following delay controller 413 and duty cycle ratio detector 411.

Figure 6:
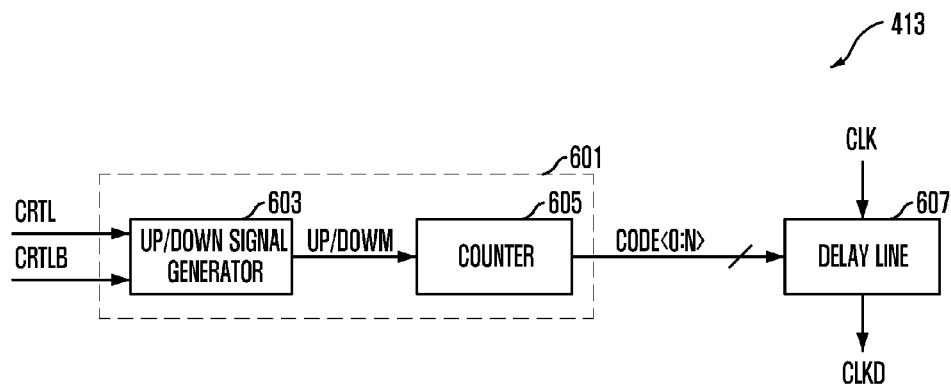
FIG. 6 is a detailed block diagram of a delay controller in FIG. 4.

FIG. 6 is a detailed block diagram of a delay controller 413 in FIG. 4. Referring to FIG. 6, the delay controller 413 includes a delay determining circuit 601 and a delay line 607. The delay determining circuit 601 determines the delay degree of the internal clock CLK by detecting the logic level difference between the correction signals CRTL and CRTLB. The delay line 607 delays the internal clock CLK in response to a result from the delay determining circuit 601. The delay determining circuit 601 includes a UP/DOWN signal generator 603 and a counter 605.

The UP/DOWN signal generator 603 receives the correction signals CRTL and CRTLB to generate UP/DOWN signals. The UP/DOWN signal generator 603 may include a XOR gate. If duty cycle ratio of the internal clock CLK is not 50:50, the logic levels of the correction signals CRTL and CRTLB are opposite to each other. In this case, the UP/DOWN signal generator 603 outputs the UP signal. If the duty cycle ratio of the internal clock CLK is 50:50, the correction signals CRTL and CRTLB are not changed to the logic levels opposite to each other. In this case, the UP/DOWN signal generator 603 outputs the DOWN signal.

The counter 605 outputs a value-increasing binary code CODE<0:N> in response to the UP signal. For example, a value of the binary code CODE<0:N> may be set to 001 as an initial value, and increase like 010 and 100. The counter 605 does not increase the value of the binary code CODE<0:N> in response to the DOWN signal.

As the value of the binary code CODE<0:N> increases, the delay degree of the delay internal clock CLKD increases. The number N+1 of bits of the binary code CODE<0:N> is determined by a relationship with the delay line 607. As the degree of delay by the delay line 631 increases, the number N+1 of bits of the binary code CODE<0:N> also increases.

Figure 7:
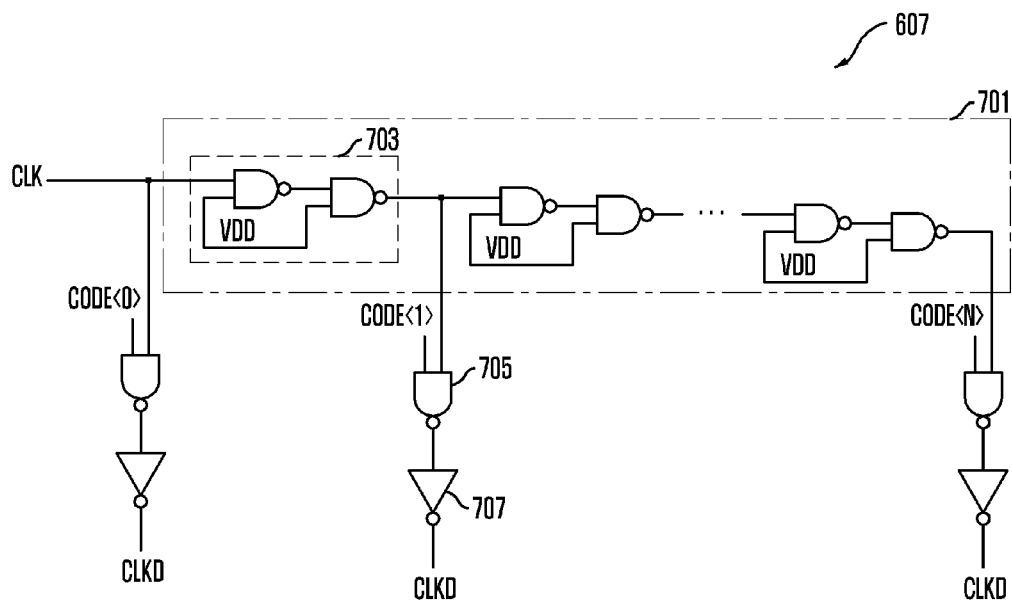
FIG. 7 is a detailed block diagram of a delay line in FIG. 6.

FIG. 7 is a detailed block diagram of the delay line 607 in FIG. 6. Referring to FIG. 7, the delay line 607 includes a plurality of NAND gates 701 series-connected. The degree of delay of the delay internal clock CLKD is determined in accordance with the number of the NAND gates driving the internal clock CLK in response to the binary code CODE<0:N>. For example, the delay line 607 outputs the internal clock CLK without a delay in response to the binary code code<0>. The internal clock CLK is driven by the plurality of NAND gates 703 in response to the binary code code<1>, and the delay internal clock CLKD is output by an AND gate (705+707). As the value of the binary code CODE<0:N> increases, the number of the NAND gates driving the internal clock CLK increases. Accordingly, the degree of delay of the delay internal clock CLKD increases.

Figure 8:
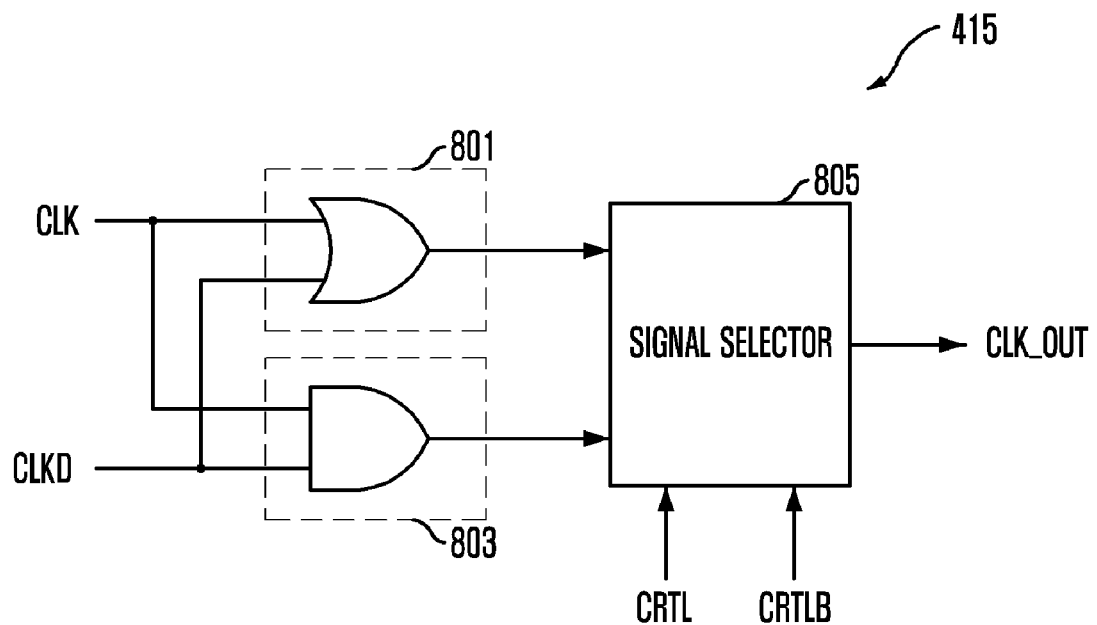
FIG. 8 is a detailed block diagram of a duty ratio correction in FIG. 4.

FIG. 8 is a detailed block diagram of the duty cycle ratio correction circuit 415 in FIG. 4. Referring to FIG. 8, the duty cycle ratio correction circuit 415 includes a first logical operator 801, a second logical operator 803 and a signal selector 805.

The first logical operator 801 outputs a first logic level when the logic levels of the internal clock CLK and the delay internal clock CLKD are all high or different from each other. The first logical operator 801 outputs the second logic level when the logic levels of the internal clock CLK and the delay internal clock CLKD are all low. The second logical operator 803 outputs the first logic level when the logic levels of the internal clock CLK and the delay internal clock CLKD are all high. The second logical operator 803 outputs the second logic level when the logic levels of the internal clock CLK and the delay internal clock CLKD are all low or different from each other. The first logic level and the second logic level are in the reversed relation to each other.

The signal selector 805 outputs the result of the first logical operator 801 in response to the correction signals CRTL and CRTLB, when the high level section of the internal clock CLK is narrower than the low level section. The signal selector 805 outputs the result of the second logical operator 803 in response to the correction signals CRTL and CRTLB, when the high level section of the internal clock CLK is wider than the low level section.

The first logical operator 801 may include the OR gate, and the second logical operator 803 may include the AND gate. The OR gate outputs the logic high level if any of logic high level exists among the logic levels of the input signals. On the contrary, the AND gate outputs the logic low level if any of logic low level exists among the logic levels of the input signals. Accordingly, if the first logic level is the logic high level and the second logic level is the logic low level, the OR gate performs the first logical operation and the AND gate performs the second logical operation.

When the output signals from the first logical operator 801 and the second logical operator 803 are reversed, the first and the second logical operation, where the first logic level and the second logic level are the logic low level and the logic high level, respectively, is performed in the first and the second logical operators 801 and 803.

The signal selector 805 may include a level comparator which outputs a signal of a logic high level or a logic low level by comparing the logic levels of the correction signals CRTL and CRTLB. The signal selector 805 selectively outputs a result of the first logical operation or the second logical operation. When the high level section of the internal clock CLK is narrow, the duty cycle ratio of the internal clock CLK can be corrected through the first logical operation. When the high level section of the internal clock CLK is wide, the duty cycle ratio of the internal clock CLK can be corrected through the second logical operation. In these cases, the correction signals CRTL and CRTLB are changed to the opposite logic level. The level comparator outputs the signal of the logic high level or the logic low level in accordance with the logic level of the correction signal CRTL.

In response to the result of the level comparator, the signal selector 805 outputs the result of the first logical operator 801 when the high level section of the internal clock CLK is narrower than the low level section, and outputs the result of the second logical operator 803 when the high level section of the internal clock CLK is wider than the low level section.

Figure 9A:
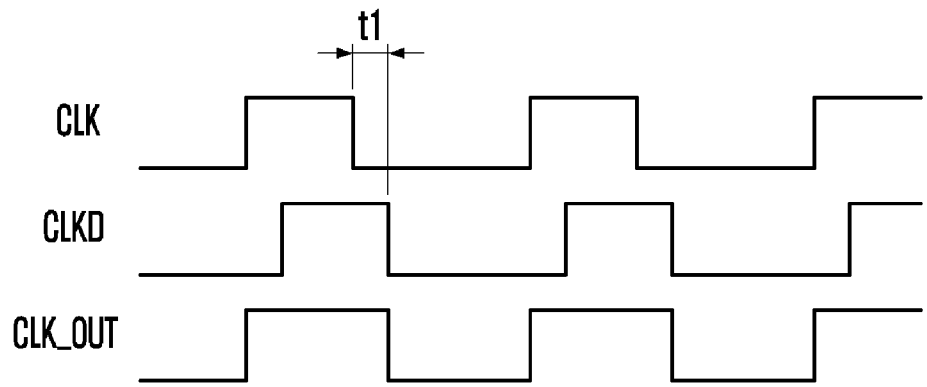
FIG. 9A is a diagram illustrating a first logical operation.

FIG. 9A is a signal timing diagram illustrating the first logical operation. Referring to FIG. 9A, the high level section of the internal clock CLK is narrower than the low level section. The duty cycle ratio of the internal clock CLK is not 50:50. Accordingly, the duty cycle ratio detector 411 outputs the correction signals CRTL and CRTLB so that the delay of the internal clock CLK and the first logical operation may be performed. The delay controller 413 outputs the delay internal clock CLKD by delaying the internal clock CLK by a first delay degree T1. The duty cycle ratio correction circuit 415 outputs the correction clock CLK_OUT by performing the first logical operation.

The first logic level and the second logic level are the logic high level and the logic low level in FIG. 9A, respectively. If any of the logic levels of the delay internal clock CLKD and the internal clock CLK is the logic high level, the logic level of the correction clock CLK_OUT is the logic high level by the first logical operation. Also, the logic level of the correction clock CLK_OUT is the logic low level in a common low level section of the internal clock CLK and the delay internal clock CLKD. Accordingly, the high level section of the internal clock CLK increases by the first delay degree T1, and the duty cycle ratio of the internal clock CLK is corrected.

Figure 9B:
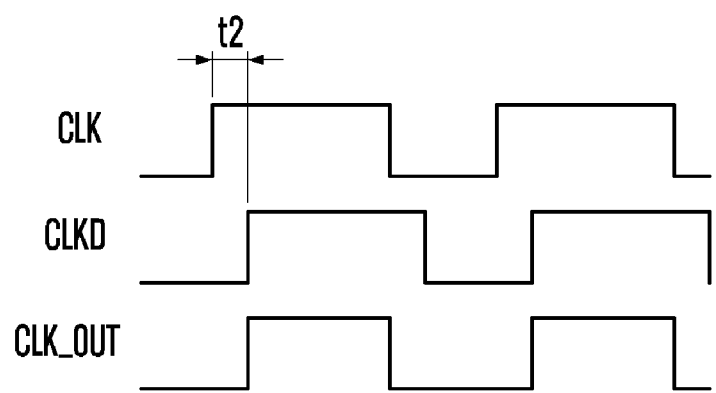
FIG. 9B is a diagram illustrating a second logical operation.

FIG. 9B is a signal timing diagram illustrating the second logical operation. Referring to FIG. 9B, the high level section of the internal clock CLK is wider than the low level section. The duty cycle ratio of the internal clock CLK is not 50:50. Accordingly, the duty cycle ratio detector 411 outputs the correction signals CRTL and CRTLB so that the delay of the internal clock CLK and the second logical operation may be performed. The delay controller 413 outputs the delay internal clock CLKD by delaying the internal clock CLK by a second delay degree T2. The duty cycle ratio correction circuit 415 outputs the correction clock CLK_OUT by performing the second logical operation.

The first logic level and the second logic level are the logic high level and the logic low level in FIG. 9B, respectively. If any of the logic levels of the internal clock CLK and the delay internal clock CLKD is the logic low level, the logic level of the correction clock CLK_OUT is the logic low level by the second logical operation. Also, the logic level of the correction clock CLK_OUT is the logic high level in a common high level section of the internal clock CLK and the delay internal clock CLKD. Accordingly, the high level section of the internal clock CLK is decreased by the second delay degree T2, and the duty cycle ratio of the internal clock CLK is corrected.

In accordance with embodiments of the invention, the area and the power consumption by the delay locked loop circuit can be reduced by using only one delay locked loop circuit unit in order to correct the duty cycle ratio.

While the invention has been described with respect to the specific embodiments, it will be apparent to those skilled in the art that various changes and modifications may be made without departing from the spirit and scope of the invention as defined in the following claims.

What is claimed is:

1. A delay locked loop circuit, comprising:
a delay locked loop unit configured to output an internal clock by delaying an external clock in order to compensate a clock skew;
a delay controller configured to output a delay internal clock by delaying the internal clock in response to correction signals;
a duty cycle ratio correction circuit configured to output an internal correction clock by increasing or decreasing a high level section of the internal clock according to the correction signals; and
a duty cycle ratio detector configured to output the correction signals in accordance with a duty cycle ratio of the internal correction clock.

2. The delay locked loop circuit as recited in claim 1, wherein a period of the internal clock is constantly maintained in the duty cycle ratio correction circuit.

3. The delay locked loop circuit as recited in claim 1, wherein the duty cycle ratio correction circuit increases or decreases the high level section of the internal clock by a delay degree of the delay internal clock by comparing logic levels of the internal clock and the delay internal clock in response to the correction signals.

4. The delay locked loop circuit as recited in claim 3, wherein the duty cycle ratio correction circuit includes:
a first logic operator configured to output a first logic level when logic levels of the internal clock and the delay internal clock are all high or different from each other, and output a second logic level when the logic levels of the internal clock and the delay internal clock are all low;
a second logic operator configured to output a first logic level when the logic levels of the internal clock and the delay internal clock are all high, and output a second logic level when the logic levels of the internal clock and the delay internal clock are all low or different from each other; and
a signal selector, responsive to the correction signals, configured to output a result of the first logical operator when a first logic level section of the internal clock is narrower than a second logic level section thereof, and output a result of the second logical operator when the first logic level section of the internal clock is wider than the second logic level section.

5. The delay locked loop circuit as recited in claim 1, wherein the delay controller includes:
a delay determining circuit configured to determine a degree of delay of the internal clock by detecting a logic level difference of the correction signal; and
a delay line configured to delay the internal clock in response to a result of the delay determining circuit.

6. The delay locked loop circuit as recited in claim 1, wherein the duty cycle ratio detector includes:
a phase separating circuit configured to output the correction clock and a reversal correction clock which is reversed from the correction clock; and
a charge pump configured to output the correction signals charged or discharged in response to each duty cycle ratio of the correction clock and the reversal correction clock and changed to logic levels opposite to each other.

7. A duty cycle correction circuit, comprising:
a delay controller configured to generate a delay clock by delaying a clock in response to correction signals;
a duty cycle ratio correction circuit configured to output a correction clock by controlling a high level section of the clock according to the correction signals; and
a duty cycle ratio detector configured to output the correction signals in accordance with a duty cycle ratio of the correction clock.

8. The duty cycle correction circuit as recited in claim 7, wherein a period of the clock is constantly maintained in the duty cycle ratio correction circuit.

9. The duty cycle correction circuit as recited in claim 7, wherein the duty cycle ratio correction circuit increases or decreases the high level section of the clock by a delay degree of the delay clock by comparing logic levels of the clock and the delay clock in response to the correction signals.

10. The duty cycle correction circuit as recited in claim 9, wherein the duty cycle ratio correction circuit includes:
a first logic operator configured to output a first logic level when the logic levels of the clock and the delay clock are all high or different from each other, and output a second logic level when the logic levels of the clock and the delay clock are all low;
a second logic operator configured to output a first logic level when the logic levels of the clock and the delay clock are all high, and output a second logic level when the logic levels of the clock and the delay clock are all low or different from each other; and
a signal selector, responsive to the correction signals, configured to output a result of the first logical operator when a first logic level section of the clock is narrower than a second logic level section thereof, and output a result of the second logical operator when the first logic level section of the clock is wider than the second logic level section.

11. The duty cycle correction circuit as recited in claim 7, wherein the delay controller includes:
a delay determining circuit configured to determine a degree of delaying the clock by detecting a logic level difference of the correction signals; and
a delay line configured to delay the clock in response to a result of the delay determining circuit.

12. The duty cycle correction circuit as recited in claim 7, wherein the duty cycle ratio detector includes:
a phase separating circuit configured to output the correction clock and a reversal correction clock which is reversed from the correction clock; and
a charge pump configured to output the correction signals charged or discharged in response to each duty cycle ratio of the correction clock and the reversal correction clock and changed to logic levels opposite to each other.

* * * * *